United States Patent [19]
Takamori et al.

[11] Patent Number: 5,514,852
[45] Date of Patent: May 7, 1996

[54] HEAT TREATMENT DEVICE

[75] Inventors: Hideyuki Takamori; Takami Satoh, both of Kumamoto, Japan

[73] Assignees: Tokyo Electron Limited, Tokyo; Tokyo Electron Kyushu Limited, Tosu, both of Japan

[21] Appl. No.: 258,206

[22] Filed: Jun. 10, 1994

[30] Foreign Application Priority Data

Jun. 10, 1993 [JP] Japan .................................. 5-163772

[51] Int. Cl.⁶ ...................................................... F27B 9/06
[52] U.S. Cl. ............................ 219/388; 219/403; 432/11
[58] Field of Search .................................... 219/385, 388, 219/390, 391, 399, 402, 403; 432/8, 11, 140

[56] References Cited

U.S. PATENT DOCUMENTS 3,601,582  8/1971  Boisfleury ................................ 219/388
4,245,613  1/1981  Wells et al. ............................. 219/388
4,486,172  12/1984  Dunning .................................... 432/11
5,378,872  1/1995  Jovanovic ................................ 219/388

FOREIGN PATENT DOCUMENTS 57-84738  5/1982  Japan .
62-5638   1/1987  Japan .
1-39645   8/1989  Japan .

*Primary Examiner*—Tu Hoang
*Attorney, Agent, or Firm*—Oblon, Spivak, McClelland, Maier & Neustadt

[57] ABSTRACT

A heat treatment device comprises a table of a thermal conductor located in a housing carrying an object of treatment thereon, and a treatment heat source located in the housing and by the table so that a bottom face of the table is opposite to a top face of the heat source, whereby the object of treatment in heat-treated through the table. An annular groove is formed in the top face of the heat source and evacuated so that the substrate and heat source are securely attached thereby increasing the heat conduction between them.

19 Claims, 7 Drawing Sheets

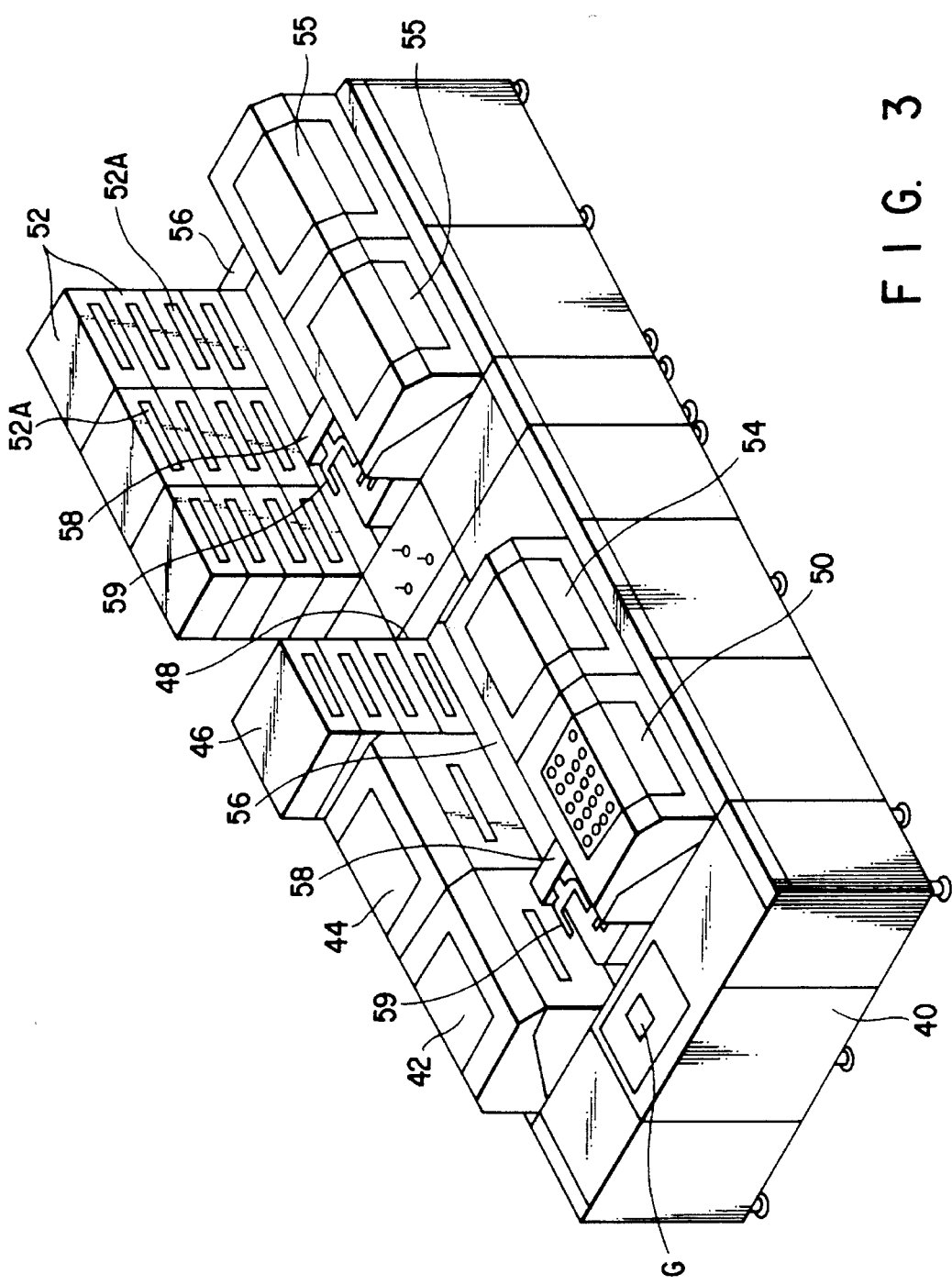
F I G. 3

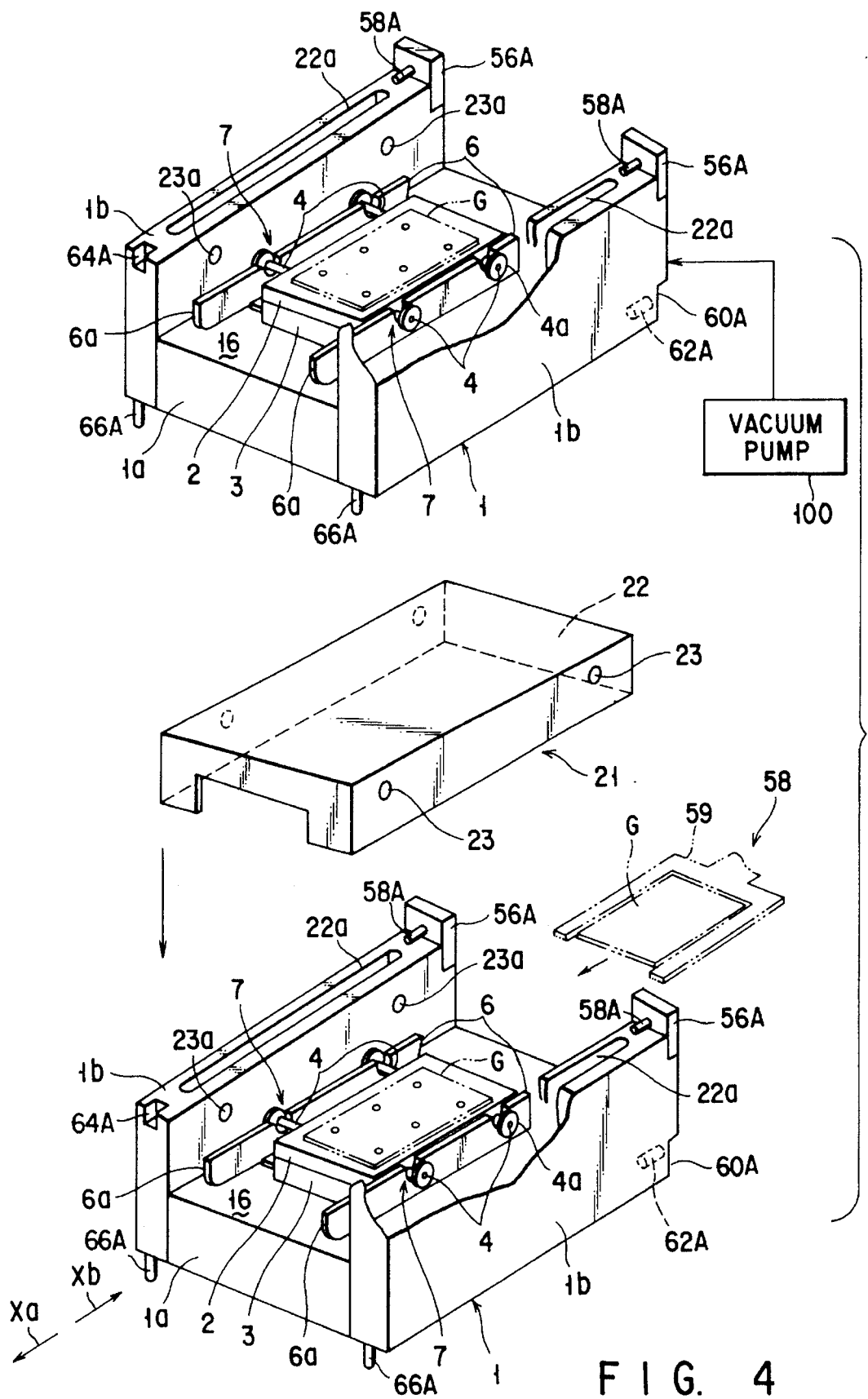
F I G. 4

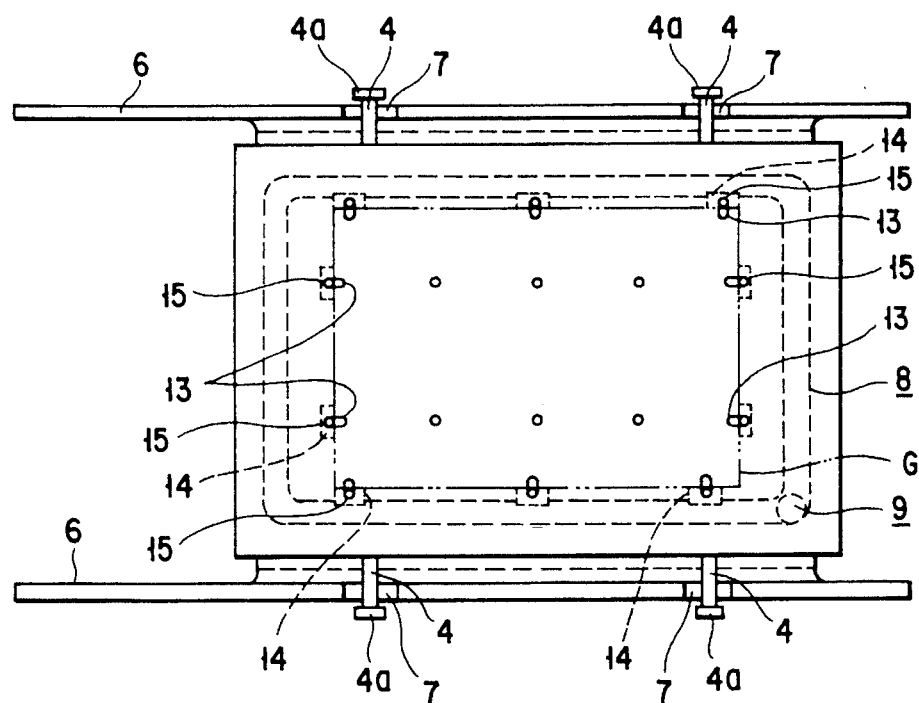
F I G. 5
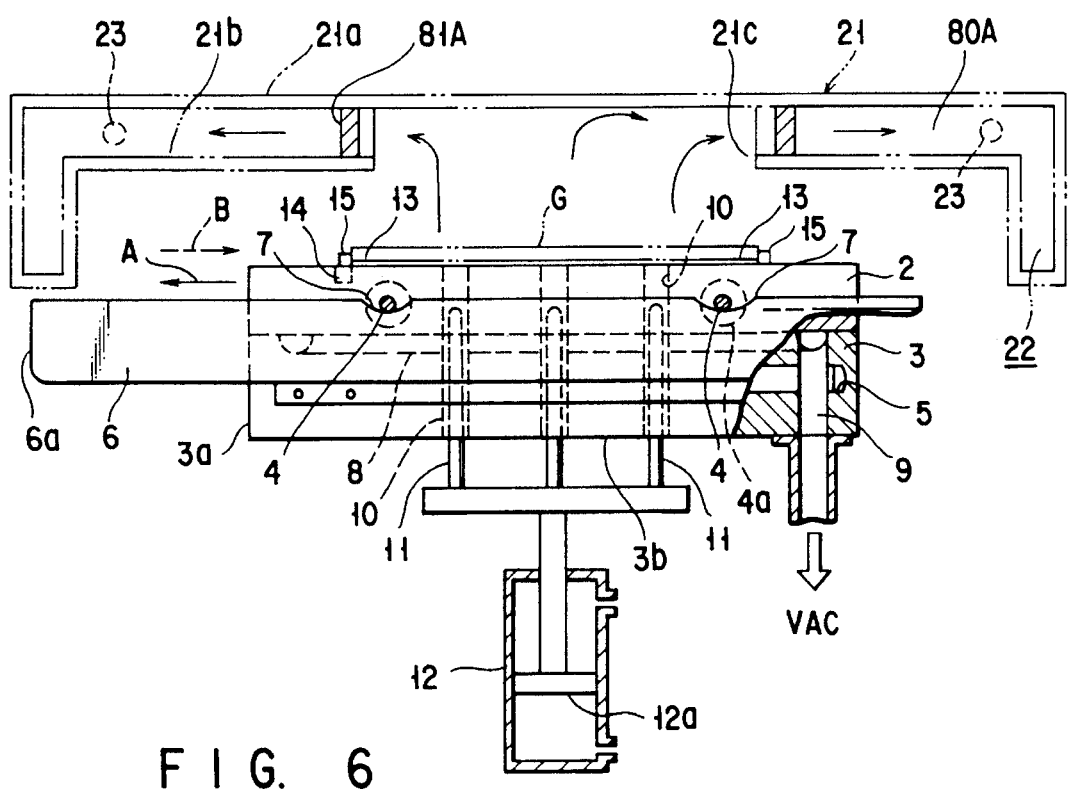
F I G. 6

5,514,852

HEAT TREATMENT DEVICE

BACKGROUND OF THE INVENTION

1. Field of the Invention

The present invention relates to a treatment device for heating or cooling an object of treatment placed on a table.

2. Description of the Related Art

Generally, in manufacturing processes for semiconductor devices or LCDs, a series of treatments is carried out such that a photoresist is applied to a silicon substrate or LCD substrate (glass substrate), circuit patterns or the like are reduced and transferred to the photoresist by photolithography, and the transferred patterns are developed.

In these treatment processes, a heat treatment device is used to heat the substrate to pre-bake or post-bake it before or after the application of the resist solution. As shown in FIG. 1 or 2, for example, the principal part of this heat treatment device 52 is composed of a hot plate 60, a heating element 62, a cover member 66, and support pins 70. The plate 60 serves as a table which carries a substrate G thereon. The heating element 62 contains a heater which supplies heat to the substrate G through the hot plate 60. The cover member 66 is located so as to define a treatment space 64 over the substrate G. Gas produced during the heat treatment is discharged from the inside of the member 66. The support pins 70 penetrate their corresponding through holes 68 in the hot plate 60 and the heating element 62, whereby the substrate G is delivered over the plate 60. In the heat treatment device 52 shown in FIG. 1, the support pins 70 are fixed, and the hot plate 60 and the heating element 62 are allowed to move by means of a piston 74 of a lift cylinder 72, so that the pins 70 project and recede from the plate 60. In the heat treatment device 52 shown in FIG. 2, on the other hand, the hot plate 60 and the heating element 62 are fixed, and the support pins 70 are connected to a piston 78 of a cylinder 76 so that it can project and recede from the plate 60. In FIG. 2, a cylindrical shutter 80 is liftably arranged around the hot plate 60. The shutter 80 is connected to a piston 84 of a shutter lift cylinder 82 so that the capacity of the treatment space 64 can be adjusted by moving the shutter 80 up and down.

In the conventional heat treatment devices of this type, however, the hot plate 60 and the heating element 62 are formed integrally with each other, so that replacement of the plate 6C for cleaning operation or change of the substrate size is troublesome, and the maintenance efficiency is poor.

In order to solve this problem, there have been proposed a heat treatment device in which the hot plate 60 and the heating element 62 are separated from each other and a substance with high thermal conductivity is interposed between the two to secure heat transfer from the element 62 to the plate 60 (see Jpn. UM Appln. KOKAI Publication No. 57-84738) and one in which a spiral sheathed heater is provided under the hot plate 60 (see Jpn. UM Appln. KOKAI Publication No. 62-5638). In either case, the hot plate 60 and the heating element 62 are not in contact with each other, so that it is difficult to heat the whole hot plate 60 uniformly. When the substrate G is heated by means of the hot plate 60, uniformity cannot be secured for the temperature distribution of treatment heat.

SUMMARY OF THE INVENTION

The object of the present invention is to provide a heat treatment device capable of equalizing the temperature distribution of treatment heat from an object of treatment and improving the efficiency of maintenance operations, such as cleaning and replacement of a hot plate.

Additional objects and advantages of the invention will be set forth in the description which follows, and in part will be obvious frown the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view showing a treatment system to which heat treatment devices according to the present invention are applied;

FIG. 4 is a schematic perspective view showing two heat treatment devices in a heat treatment device block according to one embodiment of the invention;

FIG. 5 is a partial plan view of each heat treatment device according to the embodiment;

FIG. 6 is a partial cutaway side view of each heat treatment device according to the embodiment;

DETAILED DESCRIPTION OF THE PREFERRED EMBODIMENTS

Figure 1:
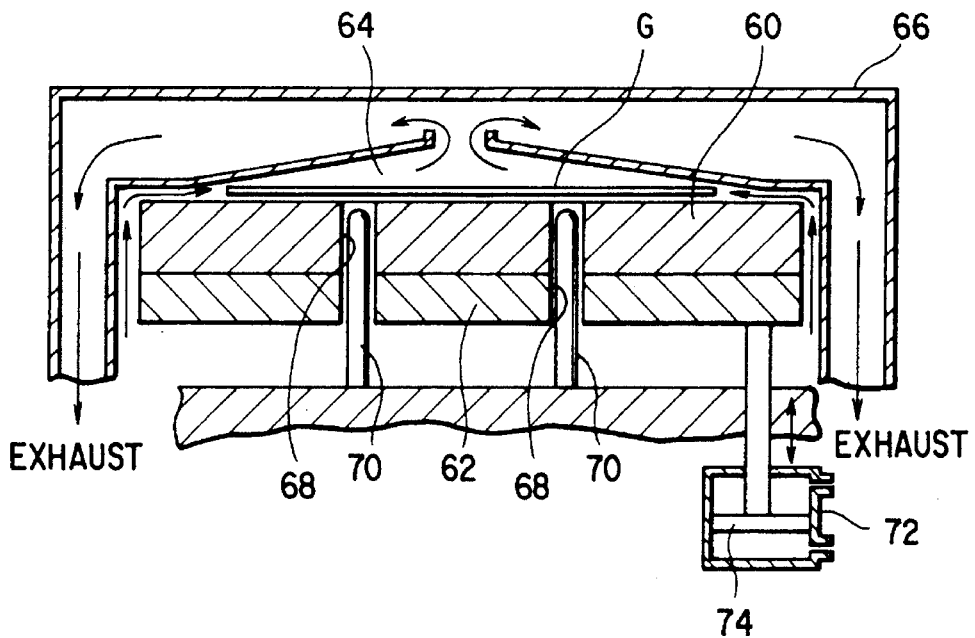
FIGS. 1 and 2 are sectional views individually showing the respective principal parts of prior art heat treatment devices of different configurations.
Figure 2:
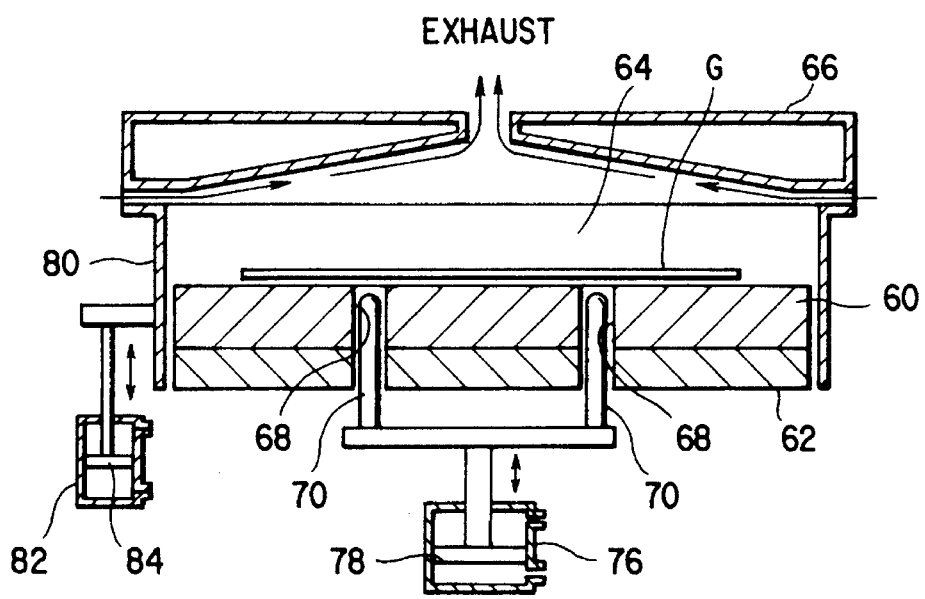

A heat treatment device according to one embodiment of the present invention will now be described in detail with reference to the accompanying drawings.

Referring first to FIG. 3, a treatment system including a number of copies of this heat treatment device will be described.

In this system, various devices are assembled together for higher operating efficiency. These devices include a loader unit 40 for loading and unloading a substrate G as an object of treatment, a brush-cleaning device 42 for brush-cleaning the substrate G, a jet-water cleaning device 44 for cleaning the substrate G by means of high-pressure jet water, and an adhesion device 46 for subjecting the surface of the substrate G to an adhesion treatment. The devices further include a cooling device 48 for cooling the substrate G to a predetermined temperature, a resist coating device 50 for applying a resist solution to the surface of the substrate G, heat treatment devices 52 according to the present invention, a resist removing device 54 for removing the resist at the peripheral edge portion of the substrate G, and a developing device 55.

A substrate transportation path 56 extends in the longitudinal direction along the top face of the central portion of the treatment system constructed in this manner. The devices 40 to 54 are arranged so that they frontally face the path 56. A substrate transportation mechanism 58 for delivering the substrate G between the devices 40 to 54 is provided so as to be movable along the path 56. The mechanism 58 includes arms 59 for retaining the substrate G thereon by vacuum suction or the like. The arms 59, which are two in number, for example, can be independently moved to substrate mounting positions for predetermined ones of the devices 40 to 54.

The heat treatment devices 52 have their respective apertures 52A on the side of the substrate transportation path 56, and are stacked in layers to form one block assembly or unit. Although only two heat treatment devices 52 are shown in FIG. 4, more devices may be stacked for each block unit. A plurality of block units are arranged along the path 56, thus forming a block.

The following is a description of a case in which the heat treatment devices are applied to use in a resist coating and developing apparatus.

The resist coating and developing apparatus picks up untreated substrates G one after another from a cassette (not shown) in the loader unit 40, which is stored with the substrates G, and transports the substrates to the brush-cleaning device 42, jet-water cleaning device 44, adhesion device 46, cooling device 48, resist coating device 50, resist removing device 54, heat treatment device 52 for pre-baking, exposure device (not shown), developing device 55, and heat treatment device 52 for post-baking, in the order named. Thereupon, the devices carry out various treatments for the substrates G, and the treated substrates G are stored in the cassette in the loader unit 40.

Referring now to FIGS. 4 to 7, the heat treatment devices according to the present invention will be described.

Figure 7:
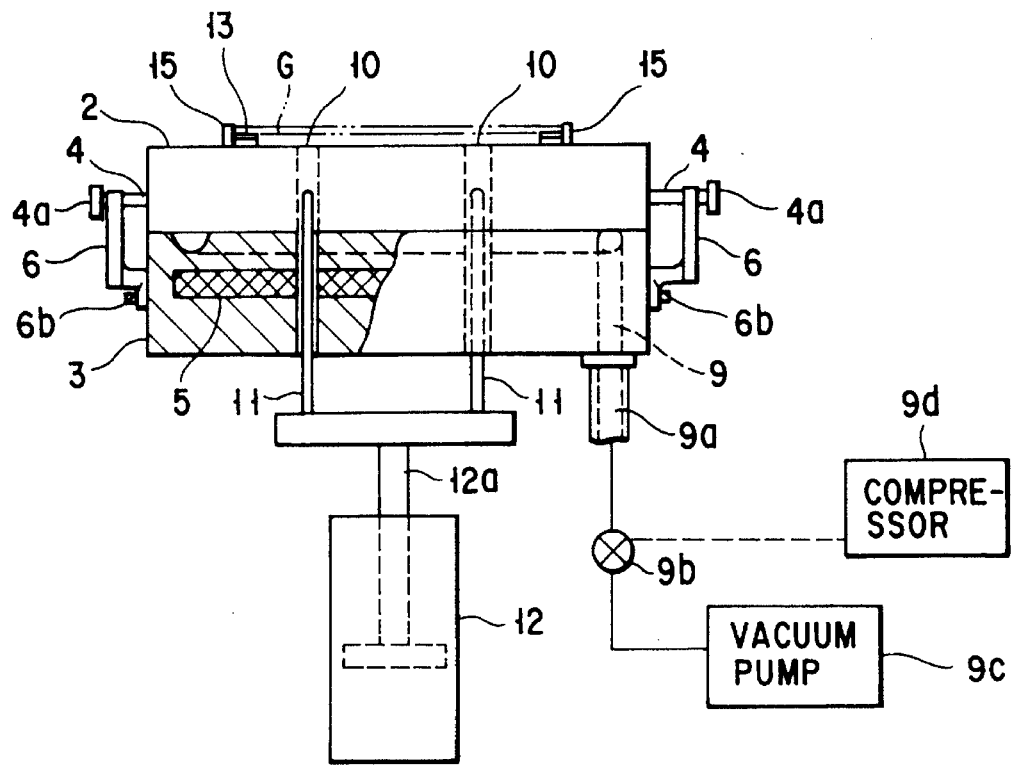
FIG. 7 is a partial cutaway front view of each heat treatment device according to the embodiment.

FIG. 4 is a schematic perspective view showing the heat treatment devices according to the one embodiment of the invention, FIG. 5 is a plan view showing the principal part of one of the heat treatment devices, FIG. 6 is a partial cutaway side view corresponding to FIG. 5, and FIG. 7 is a partial cutaway front view corresponding to FIG. 5.

This heat treatment device, and comprises a casing 1 which is substantially rectangular in shape constitutes a housing. The casing 1 has a base plate 1a, a pair of side walls in which protrude individually upward from the opposite sides of the base plate 1a and face each other in parallel relation, front and rear walls (not shown), and a top opening. The top opening may be closed by means of a removable or swingable lid or the base plate 1a of another heat treatment device overlying the device concerned, which will be mentioned later. The front and rear walls may be provided with openable shutters or openable gate valves. Vertically arranged in the casing 1 are a table 2 which carries thereon a substrate as an object of treatment, e.g., a glass substrate G for an LCD, and a treatment heat source or heating element 3 for supplying heat to the substrate G through the table 2.

The table 2 is formed of a rectangular aluminum-alloy plate with good thermal conductivity, and its top and bottom faces are flat, smooth surfaces which extend parallel to each other. Two fixed support shafts 4 protrude from each of the parallel opposite side faces of the table 2 at right angles thereto. These support shafts 4, four in total number, are located on the same horizontal plane, and each pair of opposite shafts 4, front or rear, are coaxially in alignment with each other. The distance between the front and rear support shafts 4 on one side is equal to that on the other side. A disk-shaped knob 4a is mounted on the extreme end portion of each support shaft 4. These knobs 4a serve to facilitate the lift, movement, and transportation of the table 2 as they are held by hands, and to prevent the table 2 from moving excessively in the crosswise direction as it is moved longitudinally along guide members, which will be mentioned later.

The heating element 3 is formed by embedding an electric heater 5 in an aluminum-alloy plate with substantially the same plane dimensions as the table 2. The top face of the element 3 is flat and smooth enough to be intimately in contact with the bottom face of the table 2. A heat reflecting film or sheet covers the whole bottom face of the heating element 3. The reflecting film, which is formed of an aluminum sheet, for example, reflects heat from the heater 5 toward the film, thereby improving the thermal efficiency of the heating element and preventing the base plate 1a from being heated. A pair of rail-shaped guide members 6 are arranged individually at the right- and left-hand side portions of the heating element 3. The guide members 6 guide the table 2 in the longitudinal direction (Xa- or Xb-direction) with the support shafts 4 engagedly carried thereon. Each guide member 6 is in the form of an elongate plate, and is fixed to its corresponding side face of the heating element 3 at a predetermined distance therefrom by means of an arm portion 6b (FIG. 7). The members 6 extend parallel to each other in the longitudinal direction of the heating element 3 along the side faces thereof. A front end portion 6a of each guide member 6, which is on the near side during the attachment or detachment operation for the table 2, projects long from a front face 3a of the heating element 3. Two arcuate notch portions 7, front and rear, are formed in the top flat face of each guide member 6 so as to be spaced equally to the support shafts 4. Each notch portion 7 penetrates the guide member 6 in the crosswise direction. As the four support shafts 4 of the table 2 are fitted in their corresponding notch portions 7 (four in total number) of the right- and left-hand guide members 6, the table 2 is accurately positioned and seated on the top face of the heating element 3. In this case, the depth d of the notch portions 7 which receive the support shafts 4 is a little greater than the distance s between the bottom face of the table 2 and each shafts 4, as shown in FIG. 6, so that the table 2 can be securely seated on the top face of the heating element 3. For more accurate positioning, rugged positioning means may be formed such that it can engage the respective contact surfaces of the table and the heating element.

Figure 8:
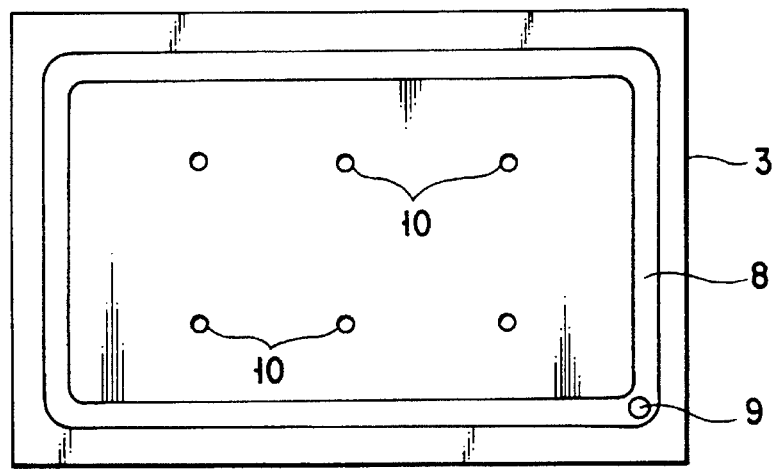
FIG. 8 is a top view of a heating element used in the heat treatment device.

An annular suction groove 8 is formed in the top face of the heating element 3 on which the table 2 is seated in the aforesaid manner, extending along the peripheral edge of the element 3 (see FIG. 8). The groove 8 constitutes joining means for compulsorily joining the table 2 to the heating element 3. The groove 8 is a rectangular groove with a width of about 1 to 5 mm and a depth of about 0.5 to 2 mm, for example, communicating with the upper end of an air passage 9 which vertically penetrates the heating element 3. In order to seal the suction groove 8 satisfactorily, it is advisable to locate a pair of sealing members, such as O-rings, between the table 2 and the heating element 3 so that the groove 8 extend between the sealing members. Although one air passage 9 is used in this embodiment, a plurality of air passages, e.g., four passages communicating with the corner portions of the rectangular suction groove 8, may be used instead. In this embodiment, the suction groove 8 is located corresponding to the peripheral portion of the substrate on which no drive section of the device is formed practically. However, the shape and location of the groove 8 may be freely selected, provided that the groove has dimensions such that it constitutes no hindrance to uniform transfer of heat from the heating element to the table with respect to the plane direction. The other end of the air passage 9 is connected to one end of a hose 9a which extends to the outside through the casing. The other end of the hose 9a is connected to a vacuum suction device including a vacuum pump 9c and a drive power circuit for the pump, through a valve 9b. When the valve 9b is closed, it connects the passage 9 and the pump 9c, so that the suction groove 3 is decompressed through the passage 9. When it is opened, the valve 9b allows the hose 9a to be open to the atmosphere so that the internal pressure of the groove 8 is equal to the atmospheric pressure. The valve 9b may be controlled electrically or manually. Alternatively, the valve 9b may be a selector valve which is also connected to a compressor 9d, as indicated by broken line in FIG. 7, so that compressed air can be supplied to the air passage. As the vacuum suction device is driven, a negative pressure is produced in the suction groove 8 by means of the hose 9a and the air passage 9, so that the bottom face of the table 2 can be attracted to the top face of the heating element 3. Moreover, the attraction can be removed by increasing the internal pressure of the groove 8 to the level of the atmospheric pressure or a higher level. The suction groove may be formed in the bottom face of the table or in each of the top and bottom faces, instead of being formed in the top face.

Through holes 10 are vertically bored through six common portions of the table 2 and the heating element 3 constructed in this manner. Support pins 11 for the delivery of substrates can be passed through the holes 10, individually. The respective lower ends of the pins 11 are connected to a piston 12a of a support pin lift cylinder 12. As the cylinder 12 is driven, the pins 11 vertically move through the table 2 and the heating element 3, thereby supporting and delivering each substrate G. The bottom wall 1a of the casing 1 may be vertically penetrated by either the support pins 11 or the piston 12a. In either case, airtight sealing means is interposed between the penetrating member and the bottom wall 1a.

A plurality of spacers 13 for keeping the substrate G and the table 2 from contact are arranged along the peripheral edge of a substrate mounting portion of the top face of the table 2. Each spacer 13 is formed of a flat oval piece of ceramics or Teflon (trademark). It is mounted on the table 2 in a manner such that a mounting screw 15 is passed through a through hole in one end portion thereof, and is screwed into a tapped hole 14 in the top face of the table 2. The substrate G is located at a distance from the top face of the table 2 as its peripheral edge rests on the respective top faces of the spacers 13. Alternatively, the substrate G may be placed directly on the top face of the table 2 without using the spacers. In order to improve the adhesion between the table and the substrate, in this case, grooves or depressions may be formed on the top face of the table 2 so that the substrate can be attracted to the top face by decompressing them. The mounting screws 15 may be arranged so that the substrate G can be positioned with respect to the plane direction as its peripheral portion is in contact with the respective outer peripheral surfaces of the screws 15.

An air chamber 22a is formed penetrating each side wall 1b of the casing 1 from top to bottom. The chamber 22a extends from the front end portion of the side wall to the rear end portion, substantially covering the overall length of the side wall. Although the air chamber 22a of each side wall 1b shown in FIG. 4 is in the form of one elongate chamber, it may alternatively be formed of a plurality of compartments communicating with one another, in order to improve the strength of the side wall. First air ports 23a are formed in the inner surface of each side wall ill so as to open into the air chamber 22a in the vicinity of the opposite end portions thereof.

As shown in FIG. 4, first and second engaging means are provided individually at the upper and lower corner ends of each side wall 1b. When the upper heat treatment device is stacked on the lower one, these engaging means serve to position and connect the two devices. The first engaging means includes a retaining plate 56A mounted on the rear end face of the side wall 1b so as to project upward for a given length, e.g., about 10 mm, from the top face of the rear end of the side wall, and a horizontal engaging pin 58A which is attached to the front face of the plate 56A and extends parallel to the top face of the side wall 1b at a predetermined distance therefrom. The pin 58A is adapted to be engagedly fitted in a horizontal engaging hole 62A which is formed in the rear face of the lower part of its corresponding side wall 1b of the upper heat treatment device. A rectangular notch portion 60A to mate with the first retaining plate 56A is formed on the rear face of the lower part of each side wall 1b. The horizontal engaging hole 62A is bored horizontally in the surface of the notch portion 60A.

The second engaging means includes a vertical engaging groove 64A in the form of a rectangular notch in the front part of the top face of each side wall 1b. As shown in FIG. 4, the engaging groove 64A opens only to the top and front faces of the side wall. A vertical engaging pin 66A, which protrudes vertically downward from the bottom face of each side wall 1b of the upper casing 1, can be engagedly inserted into its corresponding engaging groove 64A from the front. To attain this, the length of the vertical engaging pin 66A is set to be a little shorter than the depth of the engaging groove 64A.

Those casings 1 whose side walls 1b have the engaging means, as described above, are stacked in layers with dislocations in the longitudinal direction, and are positioned and connected by being slid relatively to one another in the longitudinal direction. In this state, the retaining plates 56A of the lower casing 1 engage their corresponding vertical engaging grooves 60A of each upper casing 1, and the horizontal engaging pins 58A of each lower casing 1 are fitted into their corresponding horizontal engaging holes 62A of each upper casing 1, whereby each upper casing is prevented from sliding forward. At the same time, the vertical engaging pins 66A of the each casing 1 are inserted in their corresponding vertical engaging grooves 64A of each lower casing 1, so that the heat treatment devices are positioned with respect to one another.

The air chambers 22a in the respective side walls 1b of the casings which are combined by means of the engaging means communicate with one another. In this embodiment, the casing 1 of the uppermost heat treatment device is covered by a lid (hot shown) such that the top of each air chamber 22a is sealed. The upper- or lowermost casing or each of the upper- and lowermost casings is provided with exhaust ports which open into the air chambers 22a. The exhaust ports may be connected to a vacuum pump 100 located outside the devices. For convenience, in this embodiment, the air chambers 22a of the uppermost heat treatment device is provided with the exhaust ports, to which the vacuum pump 100 is connected. Thus, the air chambers 22a of all the stacked casings can be exhaust by common means. The exhaust means for the air chambers 22a has both a heat insulating function to prevent heat in each casing 1 from being transmitted through the side walls to the outside, e.g., to the adjacent heat treatment devices, and a function for exhaust in the vicinity of the substrates G in the devices during heat treatment, which will be mentioned later.

For the exhaust in the vicinity of the substrate in each heat treatment device, a cover member 21 is provided for vertical movement in the casing 1, as shown in FIG. 6. When the cover member 21 is lowered for the heat treatment, a treatment chamber is defined by member 21 and the bottom wall 1a, and the heating element 3, table 2, and substrate G thereon are located in the treatment chamber. The cover member 21 has a dual structure, including outer and inner covers 21a and 21b with an air passage 80A between them. An exhaust aperture 21c with a large opening area is formed in the central portion of the inner cover 21b. Preferably, the aperture 21c has a shape similar to that of the upper surface of the substrate G, end its center is aligned with that of the substrate. In the case where the substrate G is an oblong glass substrate or circular semiconductor wafer, for example, the aperture 21c should preferably be oblong or circular in shape. It is advisable for the exhaust aperture 21c to have an opening area substantially equal to 70% or more of the area (dimensions) of the top face of the substrate G so that gas or air over the top face can be discharged uniformly for the substantially whole area. A diffusion plate 81A is interposed between the aperture 21c and the air passage 80A so that uniform exhaust can be effected between them. The passage 80A communicates with second air ports 23 which are bored in the outer side faces of the cover member 21. When the member 21 is in its down position, the ports 23 communicate with their corresponding first air ports 23a in the side walls 1b. As a result, the heat treatment chamber inside the cover member 21 is exhausted through the exhaust aperture 21c, air passage 80A, ports 23 and 23a, and air chambers 22a. Preferably, in this case, the treatment chamber is exhausted in a slight vacuum of about −550 mmHg or less and with an exhaust flow rate of 5 to 10 mmH$_2$O. The first and second ports 23a end f23 may be aligned so as to communicate directly with one another, or arranged so as to communicate by means of a connecting member, such as a flexible or elastic tube.

The table 2 is surrounded by a liftable shutter (not shown) in the form of e square cylinder. A treatment section is separated from the outside by this shutter during the substrate heat treatment.

The following is a description of the operation of the heat treatment devices constructed in this manner.

First, the substrate G transported to the position over the table 2 by means of the transportation arm 59 of the transportation mechanism 58, as shown in FIG. 4, is delivered to the raised support pins 11, and are placed on the spacers 13 on the top face of the table as the pins 11 descend. Then, shutters or gate valves (not shown) at the front and rear portion of the casing are driven to separate the treatment section from the outside. In the treatment section, the heat from the heating element 3 is transferred to the table 2 and from the top face of the table to the substrate G. Since this heat transfer from the heating element 3 to the table 2 is achieved by heat conduction through direct contact between the aluminum-alloy members with high thermal conductivity, the heart transfer efficiency is very high. Since this heat transfer is effected substantially throughout the surfaces of contact between the bottom face of the table 2 and the top face of the heating element 3, moreover, the whole table 2 can be heated uniformly. Thus, the temperature distribution of the heat transferred from the heating element 3 to the substrate G through the table 2 is uniform, so that the substrate G can be heat-treated evenly. In mounting the table 2, a good conductor of heat, such as silicone grease, may be interposed between the table 2 and the heating element 3 by being applied to the bottom face of the table.

Figure 9A:
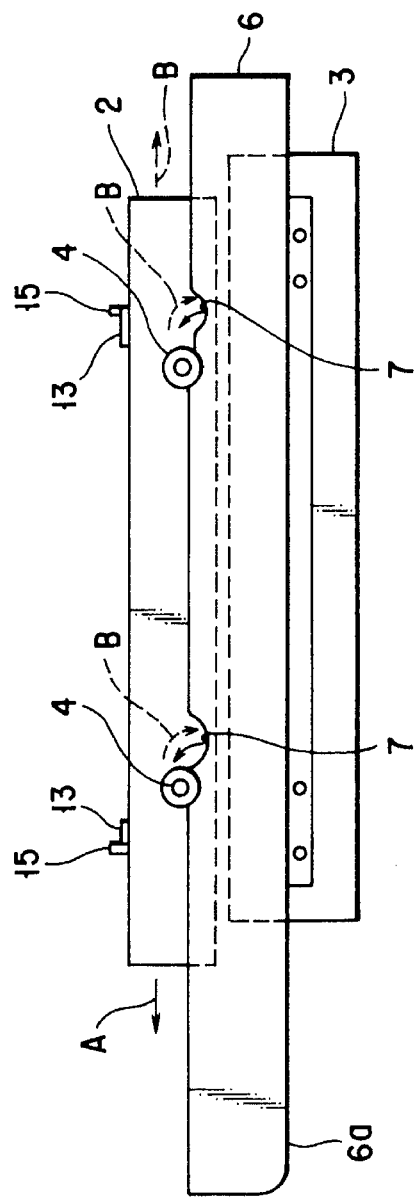
FIGS. 9A and 9B are partial side views for illustrating the procedure of attaching or detaching a mounting portion of the heat treatment device according to the embodiment.
Figure 9B:
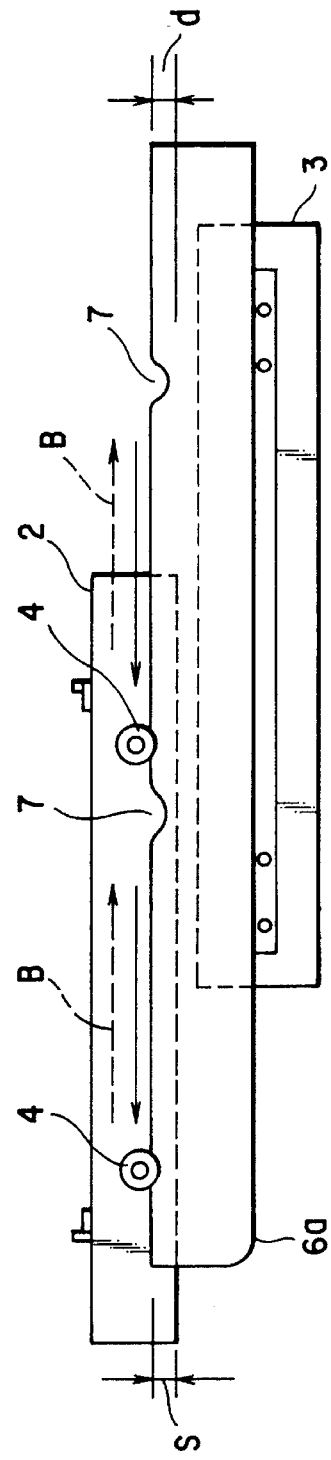

In removing the table 2 to be cleaned, replaced, inspected, or repaired after the treatment, the table 2 and the heating element 3 are first released from the vacuum suction. Thereafter, the table 2 is manually pulled forward (in the direction of full-line arrow A) with the knobs 4a held by hands so that the support shafts 4 are caused to run onto the top faces of their corresponding guide members 6 from inside the notch portions 7, as shown in FIG. 9A. Thereupon, the table 2 is lifted above the heating element 3. Subsequently, the table 2 can be easily removed by being further pulled manually in a manner such that the support shafts 4 slide, as shown in FIG. 9B.

In mounting the table 2, moreover, it can be easily placed on the top face of the heating element 3 by reversely following the aforesaid procedure. More specifically, the support shafts 4 are caused to engage the respective top faces of the guide members 6, and the table 2 is placed in the position shown in FIG. 9B. Thereafter, the table 2 is pushed in toward the heating element 3 (in the direction of broken-line arrow B) in a manner such that the support shafts 4 slide. As a result, the support shafts 4 fall into their corresponding notch portions 7, as indicated by broken-line arrow in FIG. 9B, so that the table 2 is accurately positioned on the top face of the heating element 3. As the table 2 can be mounted and removed by being slid in the longitudinal direction in this manner, it can be taken out from the front or back (in the case where the guide members extend long behind the table) of each of the stacked heat treatment devices, and another table 2 or cleaned, inspected, or repaired table 2 can be easily mounted in place. Thus, the heat treatment devices enjoy a very high maintenance efficiency. In this case, the table can be moved substantially horizontally to be loaded into or unloaded from the casing, so that the height of the aperture (in the front or rear face) through which the table is taken out need not be very great. Accordingly, the block formed by stacking a plurality of heat treatment devices can have a relatively low profile, so that the treatment system can be reduced in size.

In the embodiment described above, the table 2 is compulsorily joined to the heating element 3 by vacuum suction. However, this joining means may be replaced with magnetic joining means (see FIG. 10), for example. According to this alternative arrangement, the table 2 is formed of a magnetic material or fitted with a magnetic member 30, an electromagnet 31 is located in or outside the heating element 3, and the table 2 is compulsorily joined to the heating element 3 by applying the magnetic force of attraction of the electromagnet 31 to the magnetic material from below. In this case, the electromagnet 31 is energized to attract the table 2 by closing a switch S1 which is provided between a power source V and the magnet 31, and the table 2 is released from the attraction by opening the switch S1.

Figure 11:
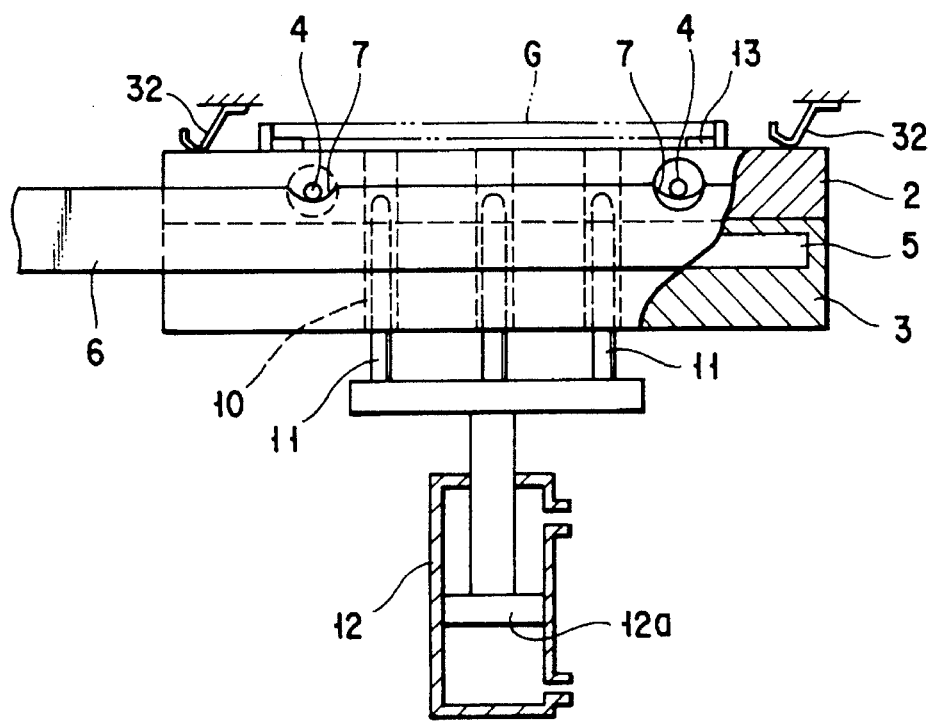
FIG. 11 is a cutaway side view showing still another example of the joining means used in the treatment device according to the embodiment.

Alternatively, the casing 1 or the cover member 21 may be provided with an elastic member, such as a leaf spring 32, which is held against the top face of the table 2, so that the table 2 can be pressed against the heating element 3 by means of the downward urging force of the spring 32, as shown in FIG. 11. Moreover, the joining means for the table 2 and the heating element 3 may be formed of a fastening mechanism which is composed of bolts and nuts. Also, the table 2 may be increased in weight so that it can be joined to the heating element 3 by gravity. Alternatively, furthermore, the table 2 may be arranged so that it can be automatically slid, dropped in, and lifted by using an air cylinder, ball screw, link mechanism, etc.

According to the foregoing embodiment, the support shafts 4 are fixed to the table 2. In order to facilitate the movement of the table 2, however, the support shafts may be rotatably mounted on the table, or otherwise, rollers may be mounted individually on stationary support shafts so that they can roll on the guide member.

Figure 10:
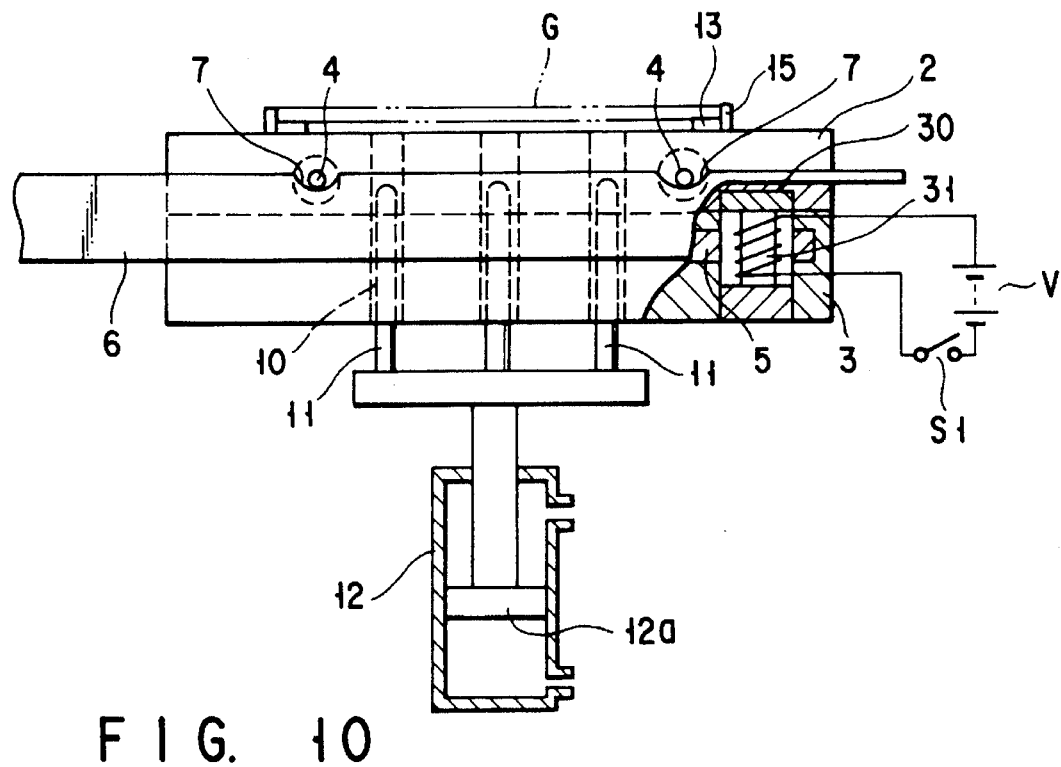
FIG. 10 is a cutaway side view showing another example of joining means used in the treatment device according to the embodiment.

FIGS. 10 and 11, like reference numerals are used to designate the same portions of the foregoing embodiment, and a description of those portions is omitted.

Although the LCD substrate has been described as the object of treatment according to the embodiments described above, the object of treatment of the present invention is not limited to the LCD substrate, and the invention may be also applied to the heat treatment of semiconductor substrates, for example.

According to the foregoing embodiments, moreover, the treatment devices are applied to the resist coating and developing apparatus. It is to be understood, however, that the treatment devices of the present invention may be also applied to apparatuses for etching agent application and magnetic liquid application, for example.

Although the heating element is used as the treatment heat source according to the embodiments described herein, furthermore, the substrate may alternatively be cooled on the table by means of a cooling fluid or Peltier effect element.

In short, the treatment devices of the present invention can produce the following prominent effects.

(1) Since the table for carrying the object of treatment thereon is removable from the heating element, it can be removed alone from each heat treatment device, so that the cleaning and maintenance efficiencies can be improved.

(2) Since the table and the heating element can be joined together by means of the joining means, the heat from the heating element can be uniformly transferred to the whole region of the table, so that the surface temperature of the table can be equalized, thus ensuring uniform heat treatment of the object of treatment as a whole.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general invention concept as defined by the appended claims and their equivalents.

What is claimed is:

1. A heat treatment device comprising:

a housing having an aperture on one end side thereof;

a table of a thermal conductor located in the housing and having a top face carrying an object of treatment thereon and a bottom face;

a treatment heat source located in the housing and having a top face overlain by the table so that the bottom face of the table is opposite to the top face of the heat source, whereby the object of treatment is heat-treated through the table;

means for joining the top face of the treatment heat source and the bottom face of the table to prevent the table and the treatment heat source from moving relative to each other while the object is heated so that heat conduction is effected between said treatment heat source and said table; and auxiliary means for positioning the bottom face of the table with respect to the top face of the treatment heat source and allowing the table to move toward the aperture with respect to the treatment heat source.

2. A heat treatment device according to claim 1, which further comprises means for disjoining the top face of the treatment heat source and the bottom face of the table from each other.

3. A heat treatment device according to claim 2, wherein the treatment heat source includes opposite sides and the table includes opposite sides, and wherein said auxiliary means includes a pair of guide members fixed individually to the opposite sides of the treatment heat source, each of said pair of guide members having a top face extending along each corresponding side of the treatment heat source and at least one notch portion formed on the top face of each of said pair of guide members, said pair of guide members extending toward the aperture, the heat treatment device further including a pair of positioning members with one of said pair of positioning members protruding from each of the opposite sides of the table and movable along the respective top faces of the guide members so that the positioning members enter the notch portions, thereby positioning the bottom face of the table with respect to the top face of the treatment heat source.

4. A heat treatment device according to claim 2, wherein the treatment heat source includes opposite sides and the table includes opposite sides, and wherein said auxiliary means includes a pair of guide members fixed individually to the opposite sides of the treatment heat source, each of said pair of guide members having a top face extending along each corresponding side of the treatment heat source, and two notch portions formed on the top face of each of said pair of guide members at a predetermined distance from each other, and two positioning members protruding from each of the opposite sides of the table and movable along the respective top faces of the guide members so that the positioning members enter the notch portions, thereby positioning the bottom face of the table with respect to the top face of the treatment heat source.

5. A heat treatment device according to claim 2, wherein said joining means includes a groove portion formed between the top face of the treatment heat source and the bottom face of the table and means for decompressing the interior of the groove portion.

6. A heat treatment device according to claim 5, wherein said groove portion includes an annular recess formed in the top face of the treatment heat source along a circumference of the treatment heat source.

7. A heat treatment device according to claim 5, wherein said disjoining means includes means for increasing an internal pressure of the groove portion to at least atmospheric pressure.

8. A heat treatment device according to claim 2, wherein said joining means includes means for magnetically attracting the treatment heat source and the table to each other, the attracting means being provided individually for the treatment heat source and the table.

9. A heat treatment device according to claim 8, wherein said attracting means includes an electromagnet attached to the treatment heat source, means for exciting the electromagnet, and means located in the table and adapted to be attracted magnetically toward the electromagnet when the electromagnet is excited.

10. A heat treatment device according to claim 5, wherein said disjoining means includes means for elastically pressing the top face of the table downward.

11. A heat treatment device comprising:

a housing having an aperture on one end side thereof;

a table of a thermal conductor located in the housing and having a top face carrying an object of treatment thereon and a bottom face;

a treatment heat source located in the housing and having a top face overlain by the table so that the bottom face of the table is opposite to the top face of the heat source, whereby the object of treatment is heat-treated through the table;

means for joining the top face of the treatment heat source and the bottom face of the table so that heat conduction is effected between said treatment heat source and said table;

auxiliary means for positioning the bottom face of the table with respect to the top face of the treatment heat source and allowing the table to move toward the aperture with respect to the treatment heat source;

means for disjoining the top face of the treatment heat source and the bottom face of the table from each other; and wherein said joining means includes means for magnetically attracting the treatment heat source and the table to each other, the attracting means being provided individually for the treatment heat source and the table.

12. A block assembly which is composed of a plurality of heat treatment devices stacked vertically in layers, each said heat treatment device comprising:

a housing having a bottom wall, a pair of side walls facing each other across a predetermined space, a loading aperture formed between respective one-side ends of the side walls, and a top opening formed between respective upper ends of the side walls;

a table of a thermal conductor located in the housing and having a top face carrying an object of treatment thereon and a bottom face;

a treatment heat source located in the housing and having a top face overlain by the table so that the bottom face of the table is opposite to the top face of the treatment heat source, whereby the object of treatment is heat-treated through the table;

means for joining the top face of the treatment heat source and the bottom face of the table so that heat conduction is effected between said treatment heat source and said table;

auxiliary means for positioning the bottom face of the table with respect to the top face of the treatment heat source and allowing the table to move toward the aperture with respect to the treatment heat source;

the bottom wall of each upper heat treatment device closing the top opening of each lower heat treatment device; and wherein each side wall of said housing has top and bottom faces, each side wall of said housing further including an air chamber having an opening at the top and bottom faces of each side wall and exhaust communicating means for connecting the air chamber of each side wall of the housing and an interior of said housing, so that the air chamber of each upper heat treatment device communicates with a heat treatment chamber of each lower heat treatment device when the respective housings of the heat treatment devices are stacked in layers.

13. A heat treatment device comprising:

a housing having an aperture on the front end side thereof;

a table located in the housing and having a top face carrying an object of treatment thereon and a level bottom face;

control means for the temperature of the top face of the table, located in the housing and having a level top face overlain by the table so that the bottom face of the table is opposite to the top face of the control means, said control means including opposite sides;

means for attracting the table to the control means and joining the top face of the control means and the bottom face of the table so that heat conducting is effected between the control means and said table;

an exhaust aperture situated over the object of treatment in the housing so as to face the object of treatment;

a pair of guide members fixed individually to the opposite sides of the control means, each of said pair of guide members having a top face extending along each corresponding side of the control means and at least one curved notch portion formed on the top face of each of said pair of guide members, and extending from the control means; and a pair of positioning members protruding from the opposite sides of the table and movable along the respective top faces of the guide members so that the positioning members enter the notch portions, thereby positioning the bottom face of the table with respect to the top face of the control means, the notch portions having a depth longer than the distance between the bottom face of the table and each positioning member.

14. A block assembly which is composed of a plurality of heat treatment devices stacked vertically in layers in a removable manner, each said heat treatment device comprising:

a housing having a bottom wall, a pair of side walls facing each other across a predetermined space, a loading aperture formed between respective one-side ends of the side walls, a top opening formed between respective upper ends of the side walls, and engaging members which are engaged with engaging members of an adjacent housing to prevent said housing and said adjacent housing from moving relative to each other;

a table of a thermal conductor located in the housing and having a top face carrying an object of treatment thereon and a bottom face;

a treatment heat source located in the housing and having a top face overlain by the table so that the bottom face of the table is opposite to the top face of the treatment heat source, whereby the object of treatment is heat-treated through the table;

means for joining the top face of the treatment heat source and the bottom face of the table so that heat conduction is effected between the treatment heat source and the table; and auxiliary means for positioning the bottom face of the table with respect to the top face of the treatment heat source and allowing the table to move toward the top opening with respect to the treatment heat source;

the bottom wall of each upper heat treatment device closing the top opening of each lower heat treatment device.

15. A block assembly according to claim 14, wherein each side wall of said hounding has top and bottom faces, each side wall of said housing further including an air chamber having an opening at the top and bottom faces of each side wall and exhaust communicating means for connecting the air chamber of each side wall of the housing and an interior of said housing, so that the air chamber of each upper heat treatment device communicates with a heat treatment chamber of each lower heat treatment device when the respective housings of the heat treatment devices are stacked in layers.

16. A block assembly according to claim 15, wherein said housing includes covet means located therein and defining a treatment chamber inside so as to cover a substrate on the table, and said exhaust communicating means includes means for connecting the air chamber and the treatment chamber inside.

17. A heat treatment device comprising:

a housing having an aperture on one end side thereof;

a table of a thermal conductor located in the housing and having a top face carrying an object of treatment thereon and a bottom face;

a treatment heat source locates in the housing and having a top face overlain by the table so that the bottom face of the table is opposite to the top face of the heat source, whereby the object of treatment is heat-treated through the table;

means for joining the top face of the treatment heat source and the bottom face of the table so that heat conduction is effected between said treatment heat source and said table;

auxiliary means for positioning the bottom face of the table with respect to the top face of the treatment heat source and allowing the table to move toward the aperture with respect to the treatment heat source;

means for disjoining the top face of the treatment heat source and the bottom face of the table from each other; and wherein the treatment heat source includes opposite sides and the table includes opposite sides, and wherein said auxiliary means includes a pair of guide members fixed individually to the opposite sides of the treatment heat source, each of said pair of guide members having a top face extending along each corresponding side of the treatment heat source and at least one notch portion formed on the top face of each of said pair of guide members, said pair of guide members extending toward the aperture, the heat treatment device further including a pair of positioning members with one of said positioning members protruding from each of the opposite sides of the table and movable along the respective top faces of the guide members so that the positioning members enter the notch portions, thereby positioning the bottom face of the table with respect to the top face of the treatment heat source.

18. A heat treatment device comprising:

a housing having an aperture on one end side thereof;

a table of a thermal conductor located in the housing and having a top face carrying an object of treatment thereon and a bottom face;

a treatment heat source located in the housing and having a top face overlain by the table sc that the bottom face of the table is opposite to the top face of the heat source, whereby the object of treatment is heat-treated through the table;

means for joining the top face of the treatment heat source and the bottom face of the table so that heat conduction is effected between said treatment heat source and said table;

auxiliary means for positioning the bottom face of the table with respect to the top face of the treatment heat source and allowing the table to move toward the aperture with respect to the treatment heat source;

means for disjoining the top face of the treatment heat source and the bottom face of the table from each other; and wherein the treatment heat source includes opposite sides and the table includes opposite sides, and wherein said auxiliary means includes a pair of guide members fixed individually to the opposite sides of the treatment heat source, each of said pair of guide members having a top face extending along each corresponding side of the treatment heat source, and two notch portions formed on the top face of each of said pair of guide members at a predetermined distance from each other, and two positioning members protruding from each of the opposite sides of the table and movable along the respective top faces of the guide members so that the positioning members enter the notch portions, thereby positioning the bottom face of the table with respect to the top face of the treatment heat source.

19. A heat treatment device comprising:

a housing having an aperture on one end side thereof;

a table of a thermal conductor located in the housing and having a top face carrying an object of treatment thereon and a bottom face;

a treatment heat source locates in the housing and having a top face overlain by the table so that the bottom face of the table is opposite to the top face of the heat source, whereby the object of treatment is heat-treated through the table;

means for joining the top face of the treatment heat source and the bottom face of the table so that heat conduction is effected between said treatment heat source and said table;

auxiliary means for positioning the bottom face of the table with respect to the top face of the treatment heat source and allowing the table to move toward the aperture with respect to the treatment heat source;

means for disjoining the top face of the treatment heat source and the bottom face of the table from each other; and wherein said joining means includes a groove portion formed between the top face of the treatment heat source and the bottom face of the table and means for decompressing the interior of the groove portion.

* * * * *